United States Patent
Dedic

(10) Patent No.: US 6,340,939 B1
(45) Date of Patent: Jan. 22, 2002

(54) SWITCH DRIVER CIRCUITRY HAVING FIRST AND SECOND OUTPUT NODES WITH A CURRENT-VOLTAGE CONVERTER CONNECTED THEREBETWEEN PROVIDING CURRENT PATHS OF FIRST AND SECOND DIRECTIONS THEREBETWEEN AND SWITCHING CIRCUITRY CONNECTED THEREWITH

(75) Inventor: Ian Juso Dedic, Northolt (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/634,738

(22) Filed: Aug. 8, 2000

(30) Foreign Application Priority Data

Nov. 10, 1999 (GB) ............................................. 9926652

(51) Int. Cl.[7] .............................................. H03M 1/00
(52) U.S. Cl. ....................... 341/136; 341/144; 341/133; 341/153; 341/136; 341/118; 341/155; 341/154; 341/119; 341/172; 327/303; 327/51; 327/563; 327/91
(58) Field of Search ................................. 341/144, 136, 341/118, 155, 153, 133, 154, 119, 172; 327/51, 91, 563

(56) References Cited

U.S. PATENT DOCUMENTS

| | | | |
|---|---|---|---|
| 4,961,015 A | 10/1990 | Shin et al. | |
| 5,194,866 A | 3/1993 | Imaizumi et al. | |
| 5,369,402 A | 11/1994 | Kwon | |
| 5,384,570 A * | 1/1995 | Dedic | ......................... 341/172 |
| 5,452,014 A | 9/1995 | Manley | |
| 5,612,697 A | 3/1997 | Mercer | |
| 5,689,257 A | 11/1997 | Mercer et al. | |
| 5,696,512 A | 12/1997 | Takiguchi | |
| 6,100,830 A * | 8/2000 | Dedic | ......................... 341/136 |
| 6,218,974 B1 * | 4/2001 | Dedic | ......................... 341/144 |

FOREIGN PATENT DOCUMENTS

GB 2 333 191 7/1999

OTHER PUBLICATIONS

Horowitz & Hill, "Field–Effect Transistors", *The Art of Electronics*, pp. 128–129, 612–620.
12–Bit, 100 MSPS+ TxDAC D/A Converter, AD9762*, *Analog Devices*, pp. 1–23.
Razari, Behzzad, *Principles of Data Conversion System Design*.

* cited by examiner

*Primary Examiner*—Michael Tokar
*Assistant Examiner*—Lam T. Mai
(74) *Attorney, Agent, or Firm*—Staas & Halsey LLP

(57) ABSTRACT

Switch driver circuity having first and second output nodes with a current-voltage converter connected therebetween and providing current paths of first and second directions between the nodes, switching circuity connected therewith being switchable between first and second states respectively permitting current flow of a common preselected magnitude in respective first and second opposite directions producing potential differences between the first and second output nodes of a common magnitude but respective, opposite polarities.

30 Claims, 10 Drawing Sheets

US 6,340,939 B1

SWITCH DRIVER CIRCUITRY HAVING FIRST AND SECOND OUTPUT NODES WITH A CURRENT-VOLTAGE CONVERTER CONNECTED THEREBETWEEN PROVIDING CURRENT PATHS OF FIRST AND SECOND DIRECTIONS THEREBETWEEN AND SWITCHING CIRCUITRY CONNECTED THEREWITH

BACKGROUND OF THE INVENTION

1. Field of the Invention

The present invention relates to switch driver circuitry for use, for example, in digital-to-analog converters.

2. Description of the Related Art

FIG. 1 of the accompanying drawings shows parts of a previously-considered current-switched digital-to-analog converter (DAC) 1. The DAC 1 is designed to convert an n-bit digital input word into a corresponding analog output signal.

The DAC 1 includes a plurality of individual binary-weighted current sources $2_1$ to $2_n$ corresponding respectively to the n bits of the digital input word applied to the DAC. Each current source passes a substantially constant current, the current values passed by the different current sources being binary-weighted such that the current source $2_1$ corresponding to a least-significant-bit of the digital input word passes a current I, the current source $2_2$ corresponding to the next-least-significant-bit of the digital input word passes a current 2I, and so on for each successive current source of the converter.

The DAC 1 further includes a plurality of differential switching circuits $4_1$ to $4_n$ corresponding respectively to the n current sources $2_1$ to $2_n$. Each differential switching circuit 4 is connected to its corresponding current source 2 and switches the current produced by the current source either to a first terminal connected to a first connection line A of the converter or a second terminal connected to a second connection line B of the converter. The differential switching circuit receives one bit of the digital input word (for example the differential switching circuit $4_1$ receives the least-significant-bit of the input word) and selects either its first terminal or its second terminal in accordance with the value of the bit concerned. A first output current $I_A$ of the DAC is the sum of the respective currents delivered to the differential-switching-circuit first terminals, and a second output current $I_B$ of the DAC is the sum of the respective currents delivered to the differential-switching-circuit second terminals. The analog output signal is the voltage difference $V_A - V_B$ between a voltage $V_A$ produced by sinking the first output current $I_A$ of the DAC 1 into a resistance R and a voltage $V_B$ produced by sinking the second output current $I_B$ of the converter into another resistance R.

FIG. 2 shows a previously-considered form of differential switching circuit suitable for use in a digital-to-analog-converter such as the FIG. 1 converter.

This differential switching circuit 4 comprises first and second PMOS field effect transistors (FETs) S1 and S2. The respective sources of the transistors S1 and S2 are connected to a common node TAIL to which a corresponding current source ($2_1$ to $2_n$ in FIG. 1) is connected. The respective drains of the transistors S1 and S2 are connected to respective first and second output nodes OUTA and OUTB of the circuit which correspond respectively to the first and second terminals of each of the FIG. 1 differential switching circuits.

Each transistor S1 and S2 has a corresponding driver circuit $6_1$ or $6_2$ connected to its gate. Complementary input signals IN and INB are applied respectively to the inputs of the driver circuits $6_1$ and $6_2$. Each driver circuit buffers and inverts its received input signal IN or INB to produce a switching signal SW1 or SW2 for its associated transistor S1 or S2 such that, in the steady-state condition, one of the transistors S1 and S2 is on and the other is off. For example, as indicated in FIG. 2 itself, when the input signal IN has the high level (H) and the input signal INB has the low level (L), the switching signal SW1 (gate drive voltage) for the transistor S1 is at the low level L, causing that transistor to be ON, whereas the switching signal SW2 (gate drive voltage) for the transistor S2 is at the high level H, causing that transistor to be OFF. Thus, in this condition, all of the input current flowing into the common node TAIL is passed to the output node OUTA and no current passes to the output node OUTB.

When it is desired to change the state of the circuit 4 of FIG. 2 so that the transistor S1 is OFF and the transistor S2 is ON, complementary changes are made simultaneously in the input signals IN and INB such that the input signal IN changes from H to L at the same time as the input signal INB changes from L to H. As a result of these complementary changes, it is expected that the transistors S1 and S2 will switch symmetrically, that is that the transistor S1 will turn OFF at exactly the same moment that the transistor S2 turns ON. However, in practice there is inevitably some asymmetry in the turn-ON and turn-OFF speeds. This can result in a momentary glitch at the common node TAIL which may in turn cause glitches at one or both output nodes of the circuit, producing a momentary error in the DAC analog output value until all of the switches have switched completely. These glitches in the analog output signal may be code-dependent and result in harmonic distortion or even non-harmonic spurs in the output spectrum.

As the size of the glitch associated with the switching of the differential switching circuit is dependent on the symmetry of the complementary changes in the input signals IN and INB, much attention has been directed to generating and delivering these input signals to the differential switching circuit synchronously with one another. However, it is found in practice that, even if the input signals are perfectly symmetrical, the drive circuits $6_1$ and $6_2$ which derive the switching signals from the input signals inevitably introduce asymmetry into the switching signals SW1 and SW2 which actually control the transistors S1 and S2. Such asymmetry results in transient output current distortion in any individual differential switch circuit. Furthermore, in a DAC employing multiple differential switch circuits, it also results in a variation between the switching times of the different circuits. These variations lower the spurious-free dynamic range (SFDR) of the DAC (a measure of the difference, in dB, between the rms amplitude of the output signal and the peak spurious signal over the specified bandwidth). These variations also lead to code-dependency of the analog output signal of the converter.

SUMMARY OF THE INVENTION

According to a first aspect of the present invention there is provided switch driver circuitry comprising: first and second output nodes; a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow; and switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities.

Such switch driver circuitry can provide improved symmetry of operation.

According to a second aspect of the present invention there is provided a switch circuit comprising: first and second output nodes; a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow; switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities; a first switch element having a control terminal connected to said first output node and switchable from an OFF state to an ON state by the change in the first-output-node potential brought about when said switching circuitry is switched from one of said first and second states to the other of those states; and a second switch element having a control terminal connected to said second output node and switchable from an ON state to a OFF state by the change in the second-output-node potential brought about when said switching circuitry is switched from said one state to said other state.

According to a third aspect of the present invention there is provided a digital-to-analog converter comprising switch driver circuitry comprising: first and second output nodes; a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow; switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities; the digital-to-analog converter further comprising: a first switch element having a control terminal connected to said first output node and switchable from an OFF state to an ON state by the change in the first-output-node potential brought about when said switching circuitry is switched from one of said first and second states to the other of those states; a second switch element having a control terminal connected to said second output node and switchable from an ON state to a OFF state by the change in the second-output-node potential brought about when said switching circuitry is switched from said one state to said other state, said first switch element being connected between first and second converter nodes and said second switch element being connected between said first node and a third converter node; and a current source or current sink connected operatively to said first converter node for causing a substantially constant current to pass through said first converter node when the converter is in use.

According to a fourth aspect of the present invention there is provided a digital-to-analog converter comprising: a plurality of differential switching circuits, each differential switching circuit having switch driver circuitry comprising: first and second output nodes; a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow; switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities; each said differential switching circuit further having: a first switch element having a control terminal connected to said first output node and switchable from an OFF state to an ON state by the change in the first-output-node potential brought about when said switching circuitry is switched from one of said first and second states to the other of those states; a second switch element having a control terminal connected to said second output node and switchable from an ON state to a OFF state by the change in the second-output-node potential brought about when said switching circuitry is switched from said one state to said other state, said first switch element being connected between first and second nodes of the differential switching circuit and said second switch element being connected between said first node and a third node of the differential switching circuit; and the respective second nodes of the differential switching circuits of said plurality being connected together, and the respective third nodes of the differential switching circuits of said plurality being connected together; and the digital-to-analog converter further comprising a plurality of current sources or current sinks, corresponding respectively to the differential switching circuits of said plurality, each current source or current sink being connected operatively to said first node of its said corresponding differential switching circuit for causing a substantially constant current to flow therethrough when the converter is in use.

DETAILED DESCRIPTION OF THE PREFERRED EMBODIMENTS

Figure 3:
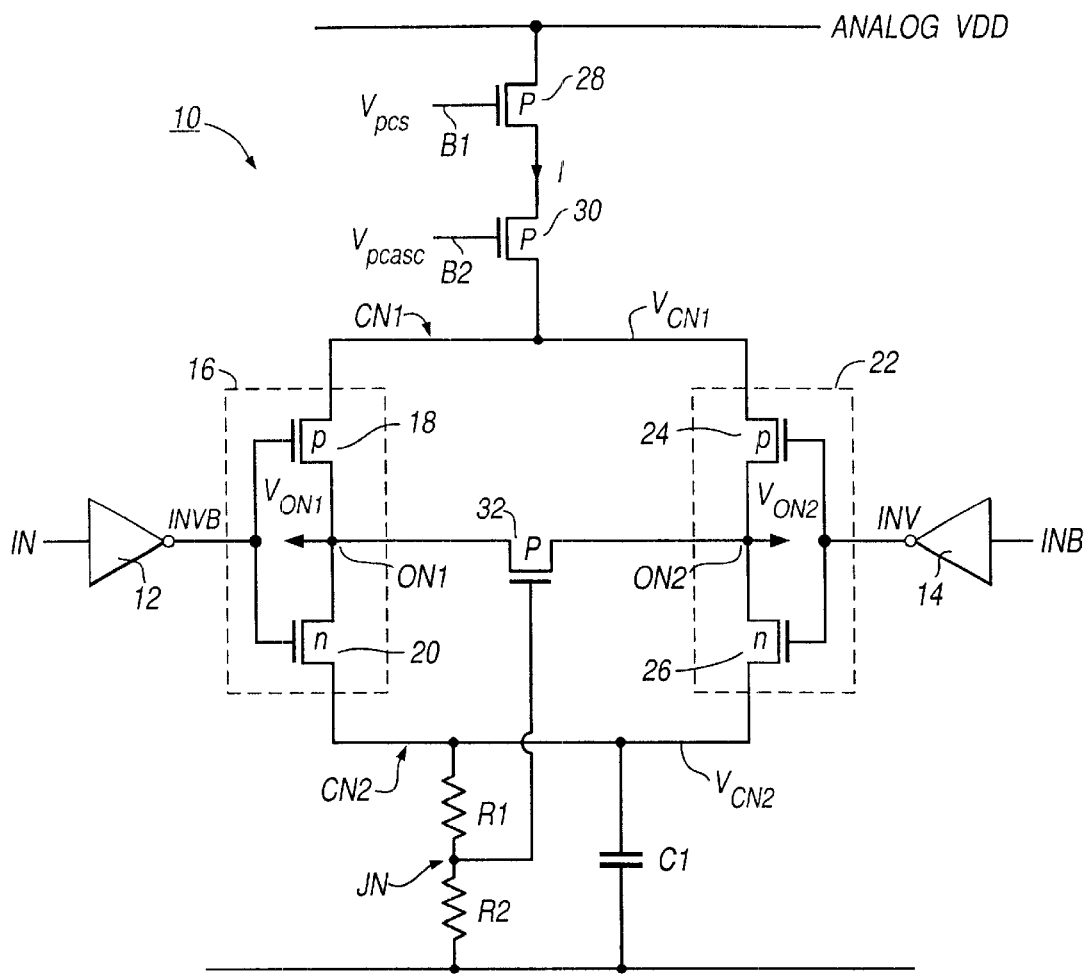
FIG. 3 shows parts of switch driver circuitry according to a first embodiment of the present invention.

FIG. 3 shows parts of switch driver circuitry according to a preferred embodiment of the present invention. The circuitry 10 includes respective first and second inverting input buffers 12 and 14. The first input buffer receives at an input thereof a first input signal IN and the second input buffer 14 receives at an input thereof a second input signal INB complementary to the first input signal IN. The first input buffer 12 inverts the received IN signal to produce at an output thereof an inverted signal INVB. Similarly, the second input buffer 14 inverts the received INB signal to produce at an output thereof an inverted signal INV. The signals IN, INB, INV and INVB are all logic signals which change between a high logic level (H) and a low logic level (L).

The inverted signal INVB is supplied from the output of the first input buffer 12 to an input of a first inverting output buffer 16. As shown in FIG. 3, the output buffer 16 includes respective PMOS FET and NMOS FET transistors 18 and 20. The PMOS FET transistor 18 has its source connected to a first common node CN1 of the circuitry, its gate connected to the output of the first input buffer 12 and its drain connected to a first output node ON1 of the circuitry. The NMOS FET 20 has its source connected to the first output node ON1, its gate connected to the output of the first input buffer 12, and its drain connected to a second common node CN2 of the circuitry.

The circuitry also includes a second inverting output buffer 22 which, like the first output buffer 16, has respective series-connected PMOS FET and NMOS FET transistors 24 and 26. The PMOS FET 24 has its source connected to the first common node CN1, its gate connected to the output of the second input buffer 14, and its drain connected to a second output node ON2 of the circuitry. The NMOS FET 26 has its source connected to the second output node ON2, its gate connected to the output of the second input buffer 14, and its drain connected to the second common node CN2.

Connected between a positive supply line ANALOG VDD and the first common node CN1 of the circuitry are a constant current source transistor 28 and a cascode transistor 30. Each of the transistors 28 and 30 is a PMOS FET. The constant current source transistor 28 has its gate connected to a first biassing line B1 of the circuitry which, in use of the circuitry, is maintained at a potential $V_{pcs}$ that is fixed relative to the potential of the positive supply line ANALOG VDD. The cascode transistor 30 has its gate connected to a second biassing line B2 of the circuitry which, in use of the circuitry, is maintained a potential $V_{pcasc}$ which is also fixed in relation to ANALOG VDD potential.

Connected between the second common node CN2 of the circuitry and a ground potential supply line GND of the circuitry are series-connected first and second resistors R1 and R2 and, in parallel with the resistors, a capacitor C1. The resistors R1 and R2 have a total resistance of approximately 5 kΩ in this embodiment, with a 1:2 resistance ratio. The capacitor C1 has a capacitance of, for example, 100 fF in this embodiment.

Connected between the first and second output nodes ON1 and ON2 of the circuitry 10 is a further PMOS FET 32. The PMOS FET 32 has first and second current-path terminals connected respectively to the first and second output nodes ON1 and ON2. One of the first and second current-path terminals is the source of the FET and the other of the current-path terminals is the drain of the FET, the source and drain designations being dependent on the in-use potentials of the output nodes. Following convention, the higher-potential current-path terminal for a PMOS FET is designated the source, and the lower-potential current-path terminal is designated the drain. As will be explained hereinafter, these designations are swapped around in use of the circuitry. The gate of the transistor 32 is connected to a junction node JN between the first and second resistors R1 and R2.

Figure 1:
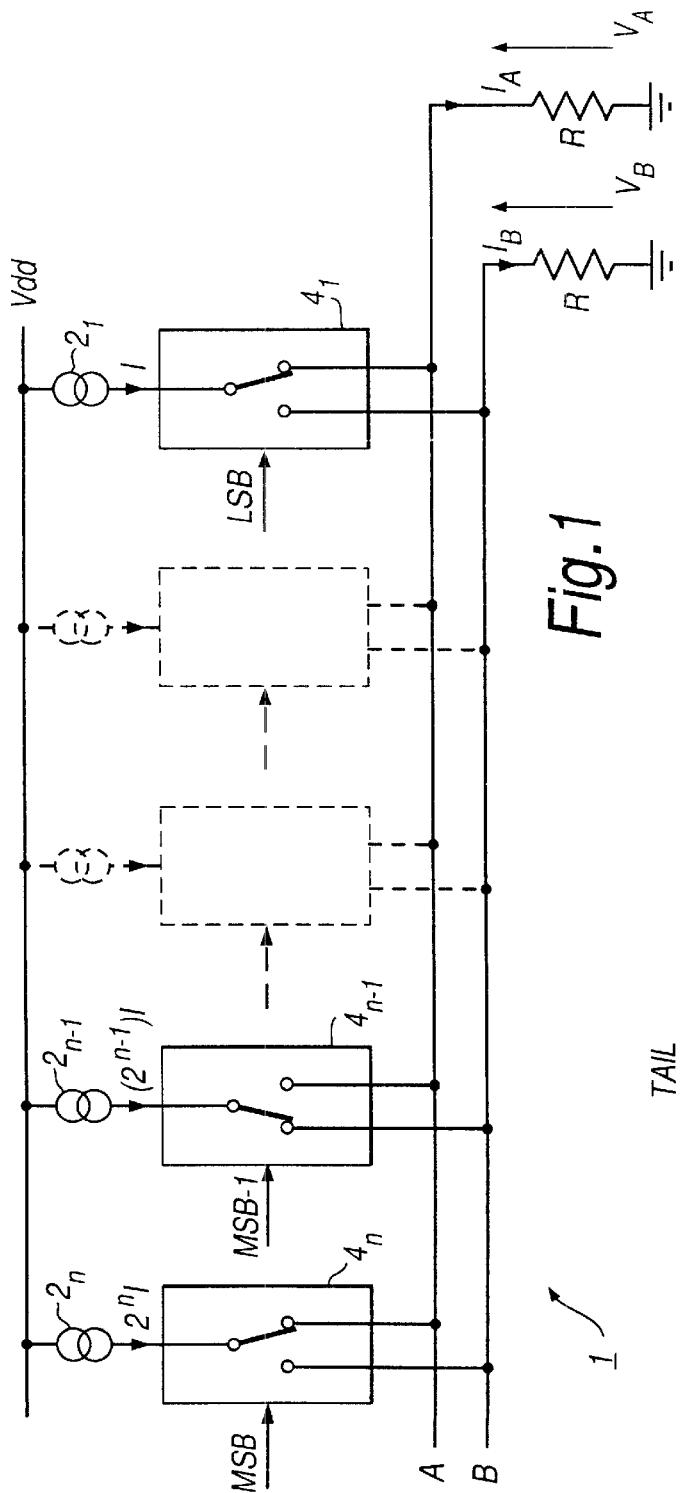
FIG. 1, discussed hereinbefore, shows parts of a previously-considered current-switched DAC.
Figure 2:
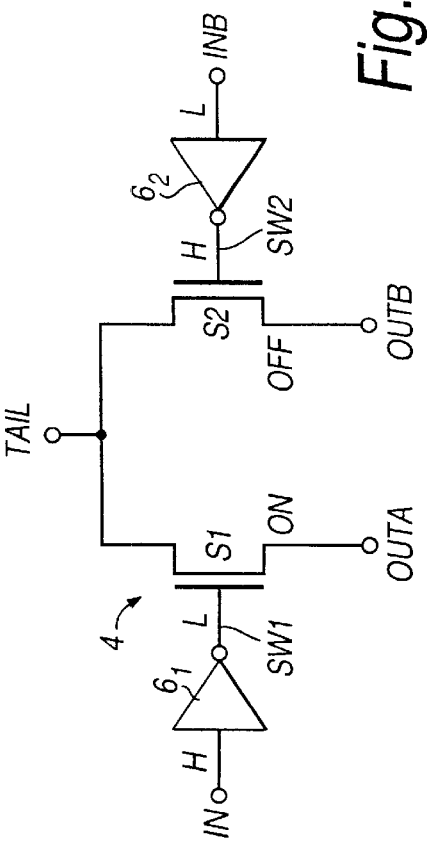
FIG. 2 shows parts of previously-considered switch driver circuitry in the FIG. 1 DAC.
Figure 4:
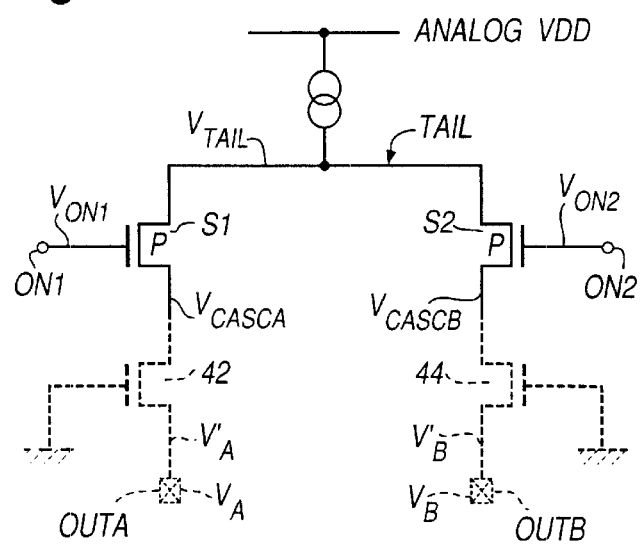
FIG. 4 shows an example of current switching circuitry to which the FIG. 3 embodiment can be connected.

As shown in FIG. 4, the FIG. 3 circuitry may be used to drive current switching circuitry of the same kind as described already with reference to FIG. 2. Accordingly, a description of the current switching circuitry is not repeated here. The first main switching transistor S1 in FIG. 4 has its gate connected to the first output node ON1 of the FIG. 3 switch driver circuitry, and the second main switching transistor S2 in FIG. 4 has its gate connected to the second output terminal ON2 of the FIG. 3 switch driver circuitry. As indicated by the parts shown with dotted lines in FIG. 4, each branch of the current switching circuitry preferably includes a cascode transistor 42 or 44 connected between the main switching transistor S1 or S2 of the branch and the output terminal OUTA or OUTB of the branch. These optional cascode transistors are described more fully in our co-pending U.S. patent application Ser. No. 09/634,588 (corresponding to United Kingdom patent application no. 9926653.8), the entire content of which is incorporated herein by reference. The cascode transistor 42 or 44 in each branch has its source connected to the drain of the main switching transistor S1 or S2 of the branch concerned, its gate connected to the ground potential supply line GND, and its drain connected to the output terminal OUTA or OUTB of the branch concerned.

Operation of the FIG. 3 and FIG. 4 circuitry will now be described with reference to FIGS. 5(A) to 5(D) and 6(A) and 6(B). Incidentally, to make the timing relationships between the various signals easier to see in FIGS. 5(A) to 5(D), FIG. 5(B) is repeated as FIG. 5(C).

Figure 5A:
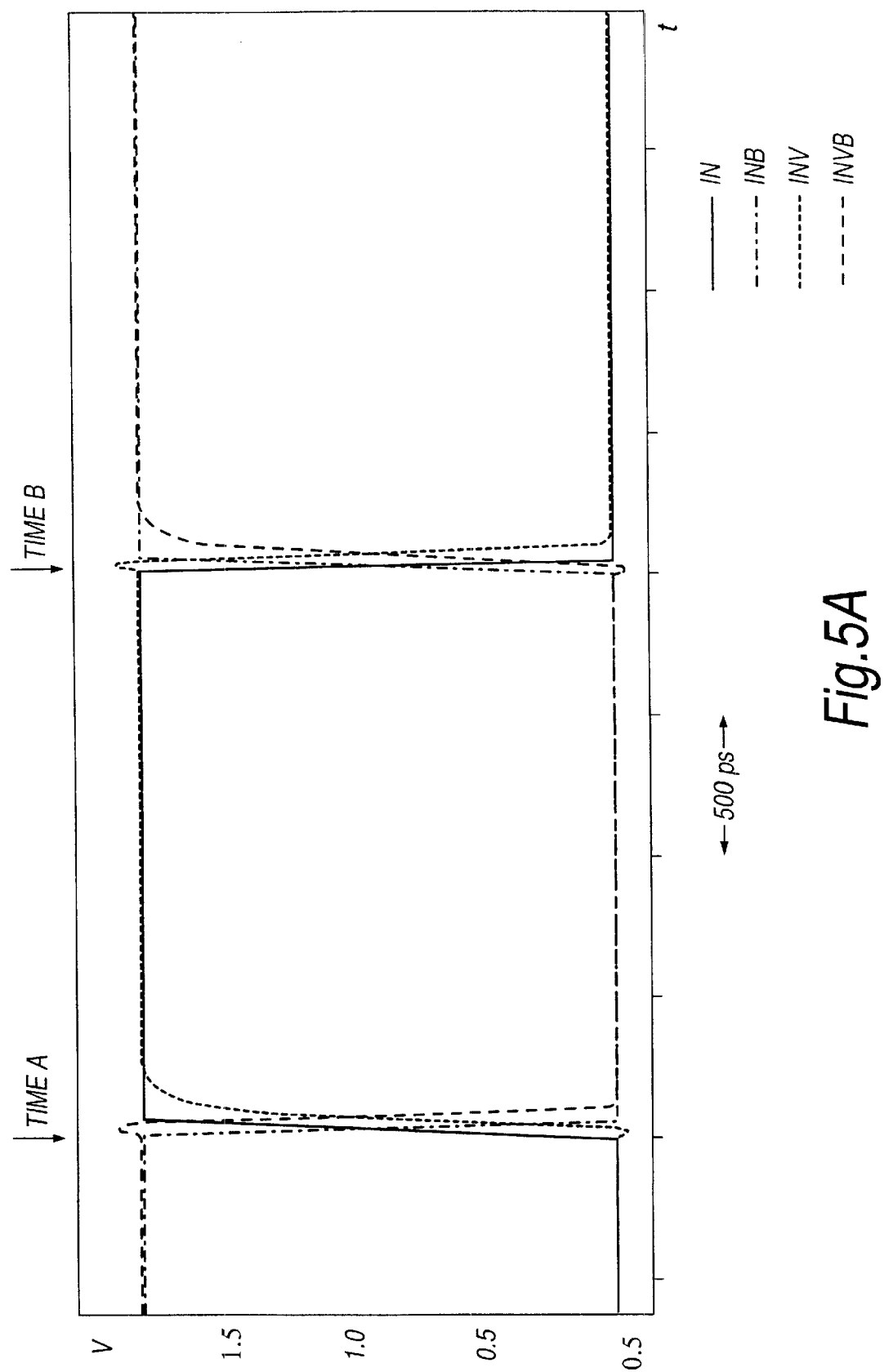
FIGS. 5(A) to 5(D) show operating waveforms generated by the FIG. 3 embodiment when in use.
Figure 5B:
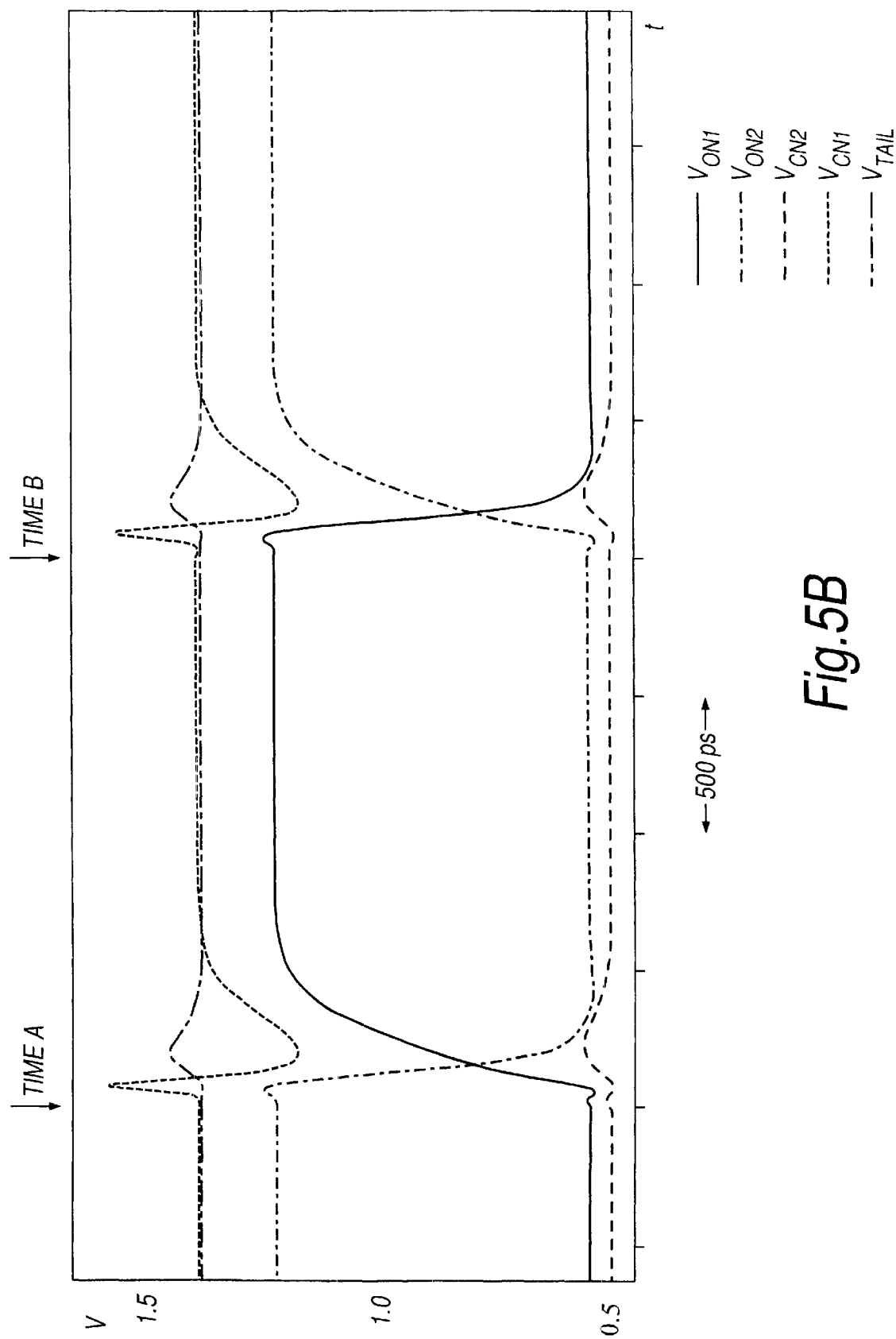
Figure 5C:
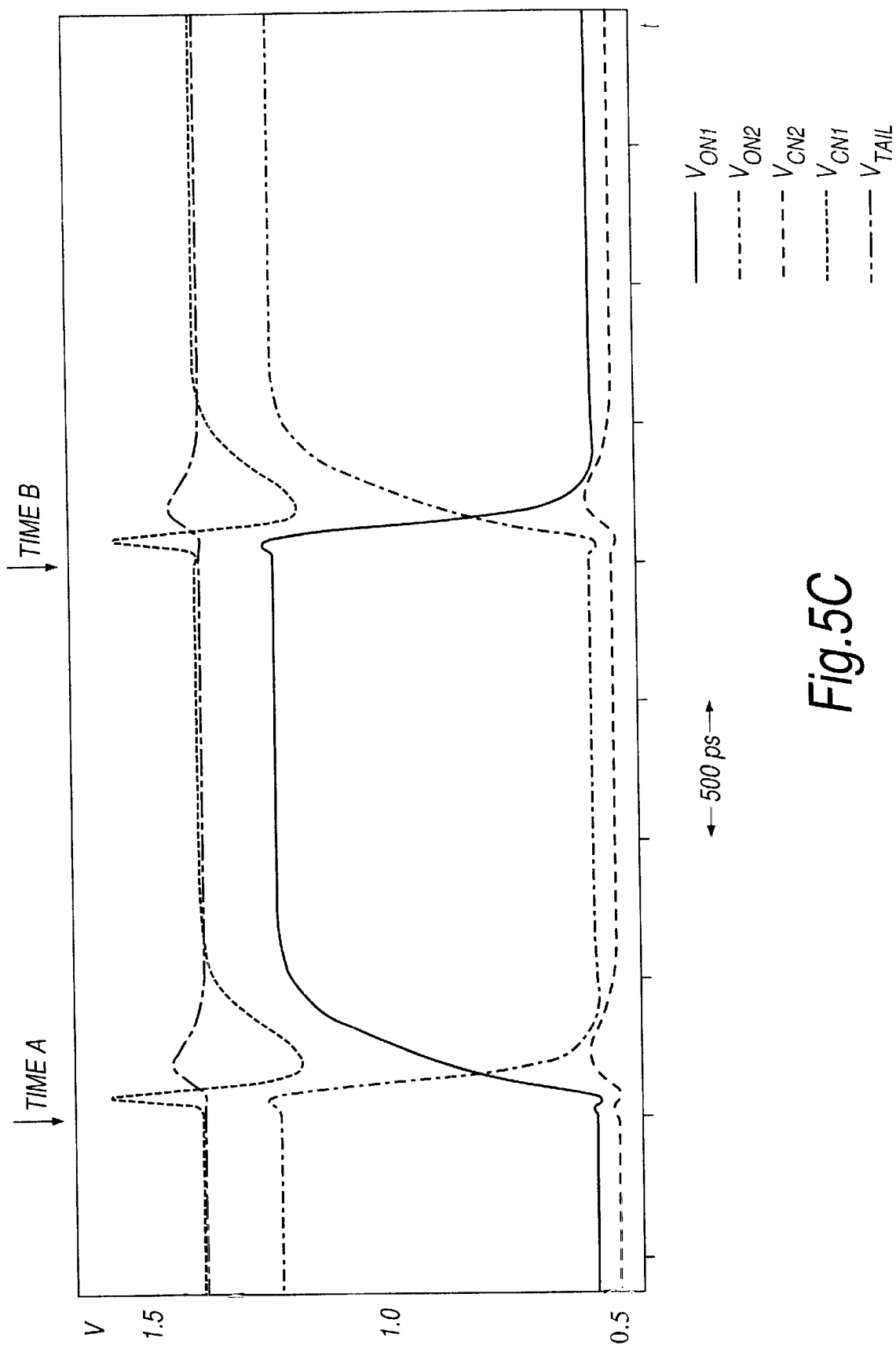

Initially, i.e. prior to time A in FIGS. 5(A) to 5(D), the first input signal IN has the low logic level L, and the second input signal INB has the high logic level H. This means that the inverted signals INVB and INB are H and L respectively. In this condition, as shown in FIG. 6(A), in the first output buffer 16 the PMOS FET 18 is OFF and the NMOS FET 20 is ON. In the second output buffer 22, the PMOS FET 24 is ON and the NMOS FET 26 is OFF.

The constant current source transistor 28 supplies a substantially constant current I from the positive supply line ANALOG VDD to the first common node CN1. The current I is, for example, 150 µA. The current I passes through the cascode transistor 30 which serves to shield the drain of the current source transistor 28 from voltage fluctuations caused by fluctuations in the potential of the first common node CN1 arising in use of the circuitry.

Thus, the current I supplied to the first common node CN1 has a first path P1 between the first and second common nodes, as shown in FIG. 6(A). This path passes (in order) through the channel of the PMOS FET 24, the second output node ON2, the channel of the PMOS FET 32, the first output node ON1, and the channel of the NMOS FET 20. From the second common node CN2, the current I then passes through the resistor R1, the junction node JN and the second resistor R2, to reach the ground potential reference line GND.

The potentials generated at the various circuitry nodes in this condition are as follows (see FIG. 5(B)). The potential $V_{JN}$ of the junction node JN is determined by the product I.R2 of the current I and the resistance of the second resistor R2 which, in this embodiment, is approximately 0.36V. Similarly, the potential $V_{CN2}$ of the second common node CN2 is determined by I(R1+R2) which, in this embodiment, is approximately 0.55V. The potential $V_{ON1}$ of the first output node ON1 is determined by the sum of the drain potential of the NMOS FET 20 and the on-state drain-source voltage of the NMOS FET 20, i.e. $V_{ON1}=V_{CN2}+V_{DS(ON)20}$. In this embodiment, $V_{DS(ON)20}$ is approximately 50 mV, so that $V_{ON1}$ is approximately 0.60V.

The current I flows through the PMOS FET 32 from the second output node ON2 to the first output node ON1. This means that the source of the transistor 32 (i.e. its higher-potential current-path terminal) is connected to the second output node ON2, and its drain is connected to the first output node ON1. The current I flowing through the transistor 32 is set high enough to place the transistor 32 in a saturated operating region. In this case, the gate-source voltage $V_{GS32}$ of the transistor 32 has an unique value determined by the current density in the transistor 32, i.e. $V_{GS32}=V_{TP}-\sqrt{(I/k)}$, where I is the current flowing through the transistor 32 and $V_{TP}$ and k are parameters of the transistor 32 determined by its physical structure.

For example, $V_{GS32}$ is approximately −0.9V in this embodiment. To obtain the source potential of the transistor 32 it is necessary to subtract this gate-source voltage $V_{GS32}$ from the gate voltage of the transistor 32. This source potential of the transistor 32 determines the potential $V_{ON2}$ of the second output node. Thus, $V_{ON2}=V_{JN}-V_{GS32}$. In this embodiment, with $V_{JN}\approx 0.36V$ and $V_{GS32}\approx -0.90V$, $V_{ON2}$ is approximately equal to 1.25V.

The potential $V_{CN1}$ of the first common node CN1 is determined by the source potential of the PMOS FET 24. This source potential is in turn determined by the drain potential of the PMOS FET 24, i.e. $V_{ON1}$, and the ON-state drain-source voltage $V_{DS(ON)24}$ of the PMOS FET 24. Thus, $V_{CN1}=V_{ON2}-V_{DS(ON)24}$. Typically, $V_{DS(ON)24}$ is approximately −150 mV, so that $V_{CN1}$ is approximately equal to 1.40V in this embodiment.

In this condition (FIG. 6(A)) the first output node ON1 has a predetermined ON output potential $V_{on}$ of the circuitry, and the second output node ON2 has a predetermined OFF output potential $V_{OFF}$ of the circuitry, i.e. $V_{ON1}=V_{on}$ and $V_{ON2}=V_{off}$. In this embodiment, $V_{on}\approx 0.60V$ and $V_{off}\approx 1.25V$. When these potentials are applied to the switching transistors S1 and S2 in the current switching circuitry, the transistor S1, which receives the ON output potential $V_{on}$, is turned ON, and the switching transistor S2, which receives the OFF output potential $V_{off}$, is turned OFF. As a result, the potential difference $V_B-V_A$ between the output terminals OUTB and OUTA is negative, as shown in FIG. 5(D).

Figure 5D:
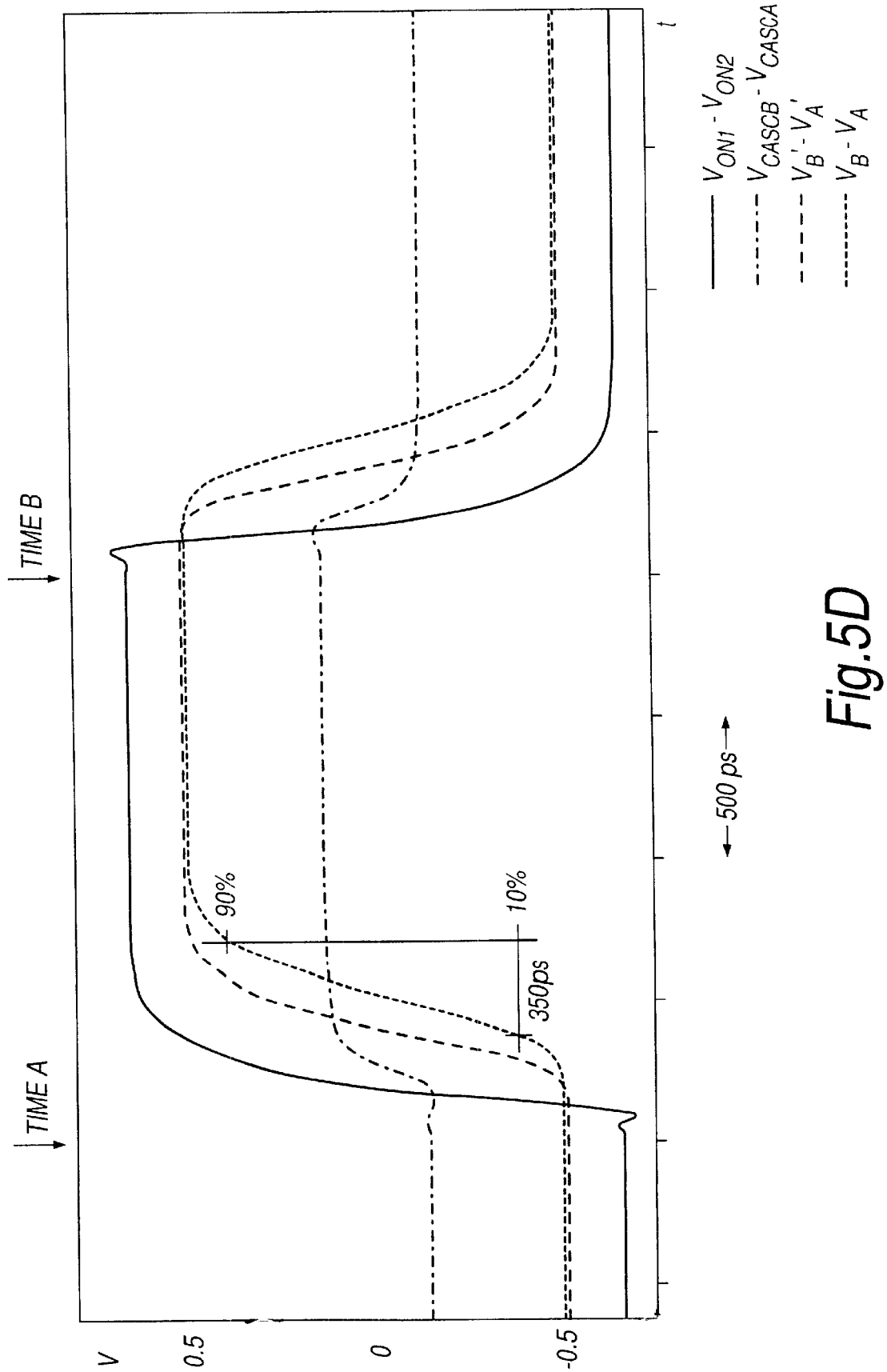
Figure 6A:
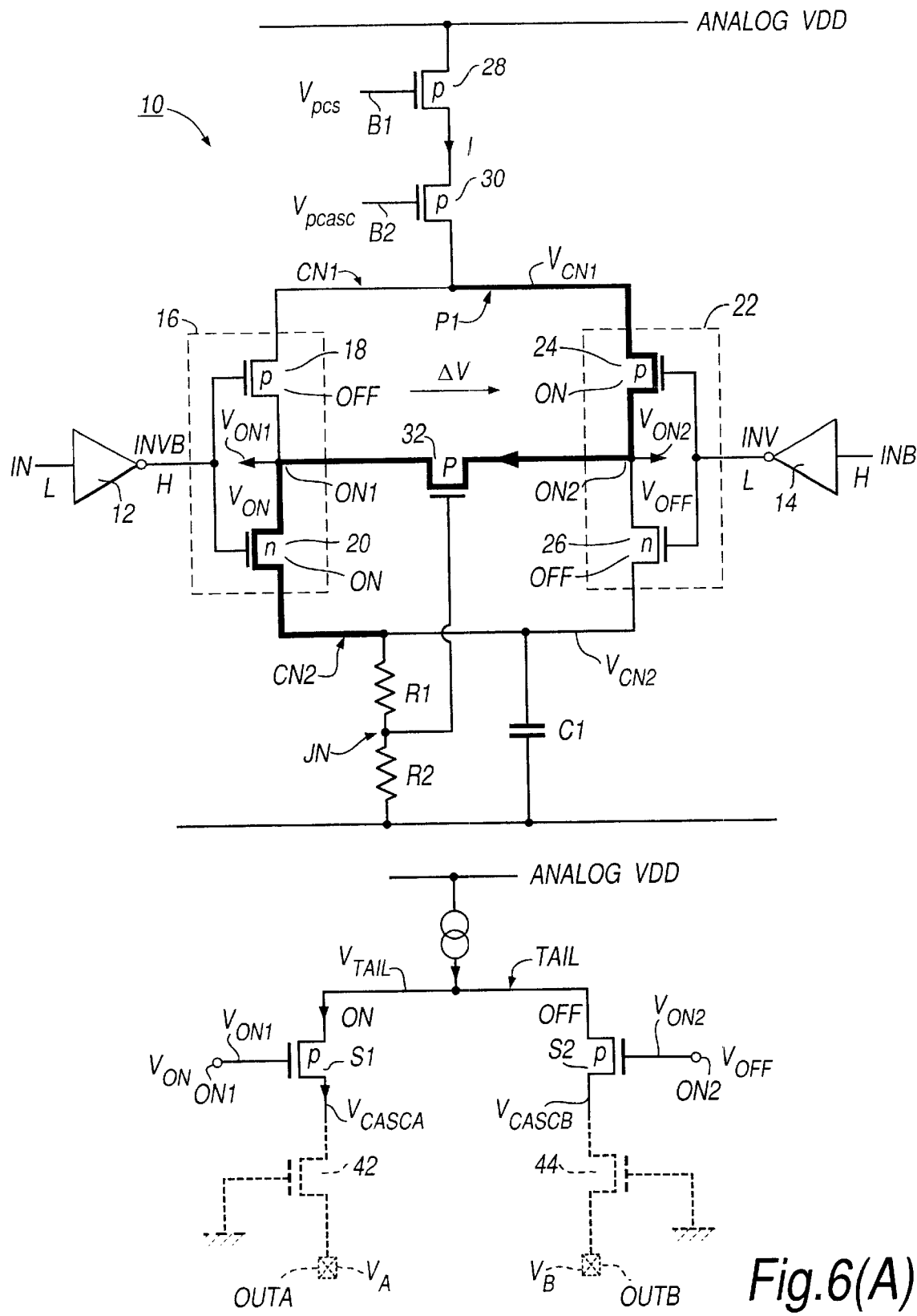
FIGS. 6(A) and 6(B) are diagrams for use respectively in explaining operation of the FIG. 3 embodiments in first and second different states.

Incidentally, the other potential differences $V_{CASCB}-V_{CASCA}$ and $V_B'-V_A'$ shown in FIG. 5(D) are internal signals within the current switching circuitry and will not be discussed further here.

Figure 6B:
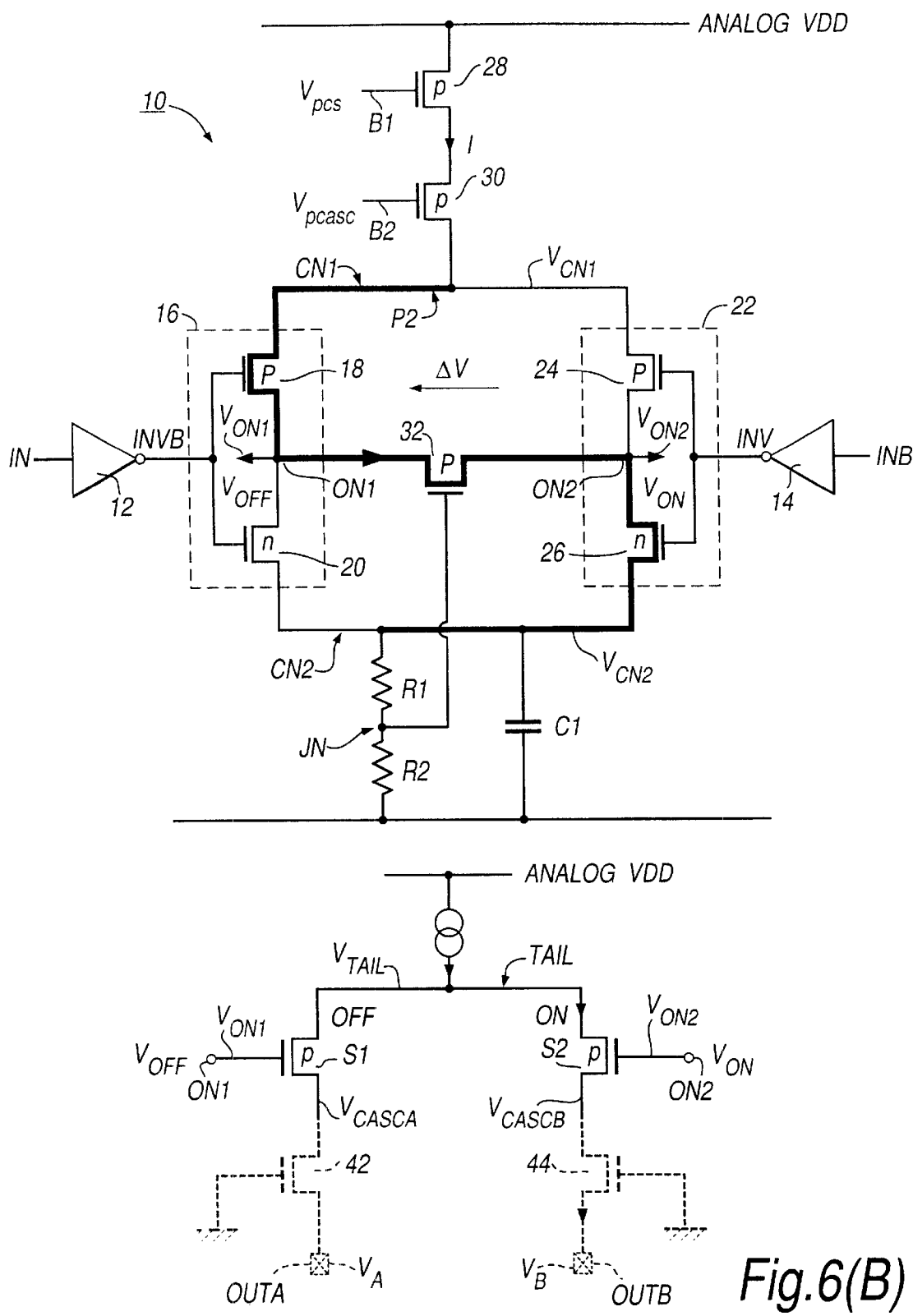

At time A in FIGS. 5(A) to 5(D) the first and second input signals IN and INB undergo respective complementary logic level changes (L to H for IN, and H to L for INB). In response to these changes the input buffer output signals INV and INVB also undergo complementary logic level changes (L to H for INV and H to L for INVB). As a result, as shown in FIG. 6(B), a second current path P2 between the common nodes CN1 and CN2 is created, different from the first current path P1 shown in FIG. 6(A). In this case, the current I supplied to the first common node CN1 by the constant current source transistor 28 flows through the channel of the PMOS FET 18 in the first output buffer 16, the first output node ON1, the PMOS FET 32, the second output node ON2 the and channel of the NMOS FET 26 in the second output buffer 22. As in FIG. 6(A), from the second common node CN2 the current flows through the resistor R1, the junction node JN and the second resistor R2, before reaching the ground potential supply line GND.

After switching has taken place, it will be appreciated that the potentials $V_{CN1}$ and $V_{CN2}$ of the common nodes are substantially unchanged from those prevailing before the switching took place, i.e. the potentials of the common nodes are the same in FIGS. 6(A) and 6(B). This is because the same current I flows through the second current path P2 in FIG. 6(B) as flows through the first current path P1 in FIG. 6(A).

Also, substantially the same ON and OFF output potentials $V_{on}$ and $V_{off}$ are generated in FIG. 6(B) as were generated in FIG. 6(A). In FIG. 6(B), however, the ON output potential $V_{on}$ is generated at the second output node ON2, and the OFF output potential is generated at the first output node ON1, i.e. $V_{ON1}=V_{off}$ and $V_{ON2}=V_{on}$.

Figure 7:
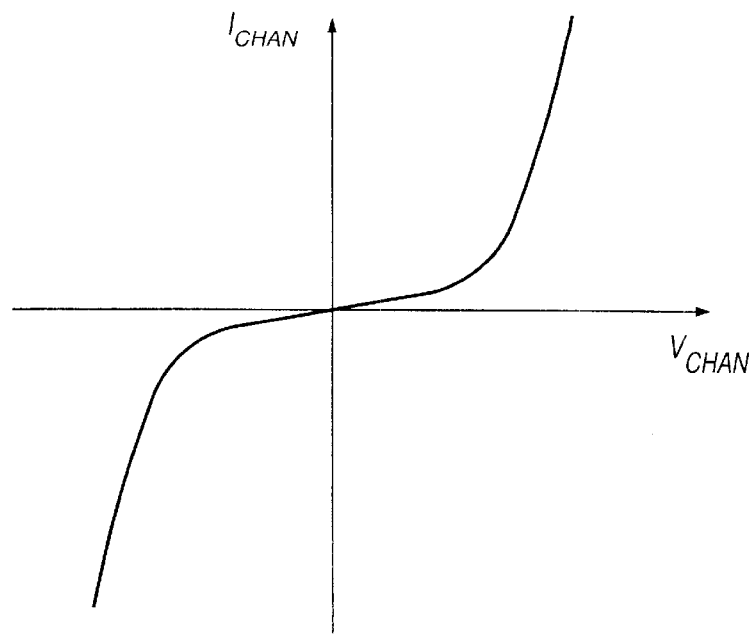
FIG. 7 shows a graph for use in explaining a current-voltage characteristic of a circuit element in the FIG. 3 embodiment.

It will also be appreciated that in FIG. 6(B), the same current I flows through the transistor 32 as flowed in the FIG. 6(A) case, but in the opposite direction, i.e. from the first output node ON1 to the second output node ON2 in FIG. 6(B). The current-voltage characteristic of the transistor 32 is shown in FIG. 7. In FIG. 7, the vertical axis represents current flowing through the transistor channel, and the horizontal axis represents the potential difference between the first and second current-path terminals (i.e. the potential difference across the transistor channel). As can be seen from FIG. 7, the I-V characteristic is perfectly symmetrical for both positive and negative values of the current flowing through the transistor, i.e. whichever direction the current is flowing. This means that the potential difference ΔV between the ON and OFF output potentials in FIGS. 6(A) and 6(B) is exactly the same. Furthermore, during switching, the potentials at the first and second output nodes ON1 and ON2 of the circuitry have the same rising and falling waveforms when switching (at time A) from the state shown in FIG. 6(A) to the state shown in FIG. 6(B) as when switching (at time B) from the state shown in FIG. 6(B) to the state shown in FIG. 6(A). This effect can clearly be seen from a comparison of the waveforms at times A and B in FIG. 5(B).

The FETs 18, 20, 24 and 26 in the output buffers 16 and 22 are desirably very small to provide for fast switching. As a consequence of their small sizes, they tend not to be closely matched. The implications of the mismatches in terms of both delay variation and amplitude variation of the ON and OFF potentials will now be considered.

In terms of delay variation, because the FETs in the switch driver circuitry are very small the rise and fall times of the output node potentials are very fast (see FIG. 5(B)). This means that although there will be delay mismatches between the FETs of the switch driver circuitry, the magnitude of the resulting delay variation at the output nodes is also very small.

In terms of amplitude variation the PMOS FETs 18 and 24 do not influence the output potentials, and so if they are not matched there is no significant impact on the symmetry of the output potentials. The NMOS FETs 20 and 26 affect the output potentials only weakly (because although $V_{on}$ is influenced by $V_{DS(ON)}$ of the NMOS FET 20 or 26 that is on, $V_{DS(ON)}$ is itself small, e.g. 50 mV). The ON and OFF output potentials therefore only have a very small asymmetry due to mismatches of the transistors in the output buffers.

The capacitor C1 is a decoupling capacitor provided to make the potential $V_{TAIL}$ in the current switching circuitry settle as fast as possible. Referring to FIG. 5(B) it can be seen that when switching occurs, $V_{TAIL}$ has a small rise. This rise is caused by the transient at the second common node CN2 that occurs during switching. In order to make $V_{TAIL}$ settle as quickly as possible it is desirable to reduce the CN2 transient. This is achieved, at the expense of a larger transient at the first common node CN1, by means of the capacitor C1 coupled between CN1 and GND. The transient on CN1 does not affect the current switching circuitry, and is therefore insignificant. The capacitance value is preferably set to provide a time constant of around 500 ps, similar to the settling times of the internal signals of the switch driver circuitry. Thus, when the sum of R1 and R2 is approximately 5 kΩ, C1 should have a capacitance of approximately 100 fF (giving a RC time constant of 500 ps).

The transistor 32 also provides the following further advantages. Firstly, as it has a non-linear I-V characteristic, the voltage developed across it is relatively large even when the current flowing through the channel is relatively low, as occurs during switching (i.e. before and after the crossover of the rising and falling waveforms in FIG. 5(B). This leads to a very fast settling time for the output node potentials after switching, because most of the switch driver current I is available for driving the output nodes rather than being wasted in the transistor 32. For example, in FIG. 5(B) it can be seen that the rising waveform, which is slower than the falling waveform, settles in approximately 600 ps. Thus, in the FIG. 3 switch driver circuitry, all of the internal signals settle in less than 600 ps. The effect of applying these fast-settling internal signals to the FIG. 4 current switching circuitry is illustrated in FIG. 5(D). In FIG. 5(D), it is assumed that the cascode transistors 42 and 44 are present. The resulting rise time of the potential difference between the output terminals OUTA and OUTB is approximately 350 ps (for the rise from 10% to 90% of full-scale value). This can provide an output bandwidth of 1 GHz, facilitating a typical sampling rate $F_{DAC}$ of the DAC of 1.6 G samples/s with a worst-case rate of 1 G samples/s.

The second advantage is that, because the transistor 32 is a PMOS FET like the transistors in the current switching circuitry of FIG. 4, its saturation drain-source voltage $V_{DS(SAT)}$ varies in the same way as the drain-source saturation voltages $V_{DS(SAT)}$ of the transistors in the current switching circuitry. This is important, as in practice, the drain-source saturation voltage $V_{DS(SAT)}$ of a PMOS transistor may vary by a factor of 2 due to process and/or temperature variations.

Considering the FIG. 4 current switching circuitry in more detail, at any given time, one of the main switching transistors S1 and S2 is OFF and the other is ON. Referring to FIG. 6(B), for the purposes of explanation it will be assumed that the OFF transistor is the transistor S1 and the ON transistor is the transistor S2. In this condition, the potential $V_{TAIL}$ of the sources of the transistors S1 and S2 is influenced by the drain-source potential of the ON transistor S2. When the switching transistors S1 and S2 have a relatively high drain-source saturation voltage $V_{DS(SAT)S}$ $V_{TAIL}$ is increased as compared to when $V_{DS(SAT)S}$ is low. This means that in order to maintain the OFF transistor S1 in the OFF condition, its gate voltage, i.e. the OFF potential $V_{OFF}$, must also be increased. This increase occurs automatically in the FIG. 3 switch driver circuitry because in that circuitry the difference between the OFF and ON potentials is increased when the drain-source saturation voltage $V_{DS(SAT)32}$ of the transistor 32 is relatively high as compared to when that drain-source saturation voltage is relatively low. Accordingly, the OFF potential is self-regulating in the FIG. 3 switch driver circuitry.

In the FIG. 3 circuitry it is also desirable to make the ON output potential track $V_{DS(SAT)32}$ of the switching transistors S1 and S2 and the cascode transistors 42 and 44 (if used) in the current switching circuitry. Considering FIG. 6(A), and assuming the cascode transistors are present, in the branch of the current switching circuitry that is on, the ON output potential $V_{on}$ must be sufficient for both the cascode transistor 42 and the switching transistor S1 to be maintained in the saturated condition, even when $V_{DS(SAT)}$ of each of those transistors varies. The nominal drain-source saturation voltage $V_{DS(SAT)S}$ of the switching transistors is, for example, 200 mV. The nominal drain-source saturation voltage $V_{DS(SAT)C}$ of the cascode transistors is, for example 300 mV. By setting $V_{on}$ to a nominal value of 0.6V the potential difference between the cascode transistor gate (GND) and the switching transistor gate ($V_{on}$) exceeds $V_{DS(SAT)C}$ by 1.5 times the nominal $V_{DS(SAT)S}$ of the switching transistor. However, as $V_{DS(SAT)S}$ and $V_{DS(SAT)C}$ can each vary by a factor of 2 with process/temperature, preferably $V_{on}$ should also increase when $V_{DS(SAT)S}$ and/or $V_{DS(SAT)C}$ increase.

This change in $V_{on}$ to compensate for variations in $V_{DS(SAT)S}$ of the switching transistors S1 and S2 (and for variations in $V_{DS(SAT)C}$ of the cascode transistors 42 and 44, if provided) can be achieved by making the resistances of the resistors R1 and R2 in the FIG. 3 circuitry variable in dependence upon $V_{DS(SAT)S}$ and/or $V_{DS(SAT)C}$. One example of control circuitry for varying the resistances will now be described with reference to FIG. 8.

Figure 8:
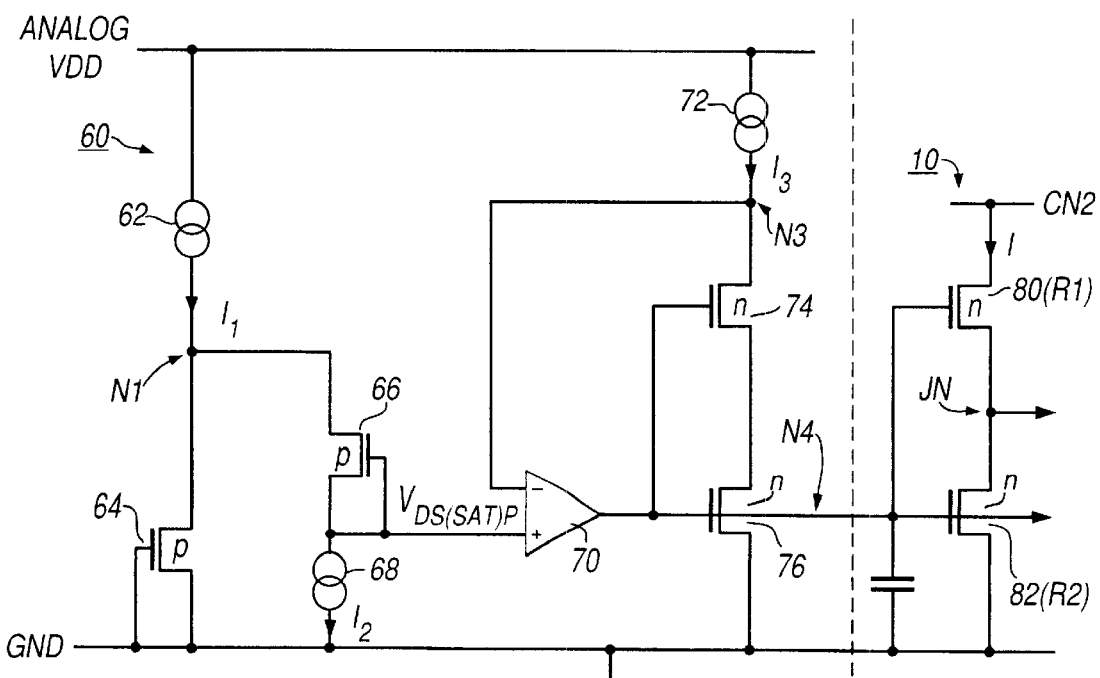
FIG. 8 shows a modification which can be applied to embodiments of the invention.

In FIG. 8 the control circuitry 60 includes a first constant current source 62 connected between a positive power supply line ANALOG VDD of the circuitry and a first node N1. A first PMOS FET 64 has its source connected to the node N1 and its gate and drain connected to the ground potential supply line GND.

The circuitry also includes a second PMOS FET 66 which has its source connected to the node N1. The gate and drain of the PMOS FET 66 are connected to a second node N2, and a constant current sink 68 is connected between the node N2 and GND.

The current $I_1$ sourced by the constant current source 62 is large compared to the current $I_2$ sunk by the constant current sink 68. Also, the first PMOS FET 64 is narrow compared to the second PMOS FET 66. For example, the width of the FET 64 is w and the width of the FET 66 is 3 w, and $I_1=4I_{sw}$ and $I_2=I_{sw}$, where $I_{sw}$ is the current which flows through each switching transistor S1 or S2 when ON.

The circuitry 60 further includes a high-output-resistance transconductance amplifier 70 having a first (negative) input connected to the node N2. A second (positive) input of the amplifier 70 is connected to a node N3 of the circuitry. A second constant current source 72 is connected between the ANALOG VDD and the node N3. First and second NMOS FETs 74 and 76 are connected in series between the node N3 and GND. The first NMOS FET 74 has its drain connected to the node N3, its gate connected to the output of the amplifier 70 and its source connected to the drain of the second NMOS FET 76. The NMOS FET 76 has its gate connected to the output of the amplifier 70 and its source connected to GND. An output node N4 of the circuitry 60 is connected to the output of the amplifier 70.

To enable the resistances of the resistors R1 and R2 in the switch driver circuitry to be varied, the resistors R1 and R2 are implemented using respective first and second series-connected NMOS FET transistors 80 and 82. The first NMOS FET 80 has its drain connected to the second common node CN2 of the switch driver circuitry 10, its gate connected to the output node N4 of the control circuitry and its source connected to the junction node JN (gate of the transistor 32) in the switch driver circuitry 10. The NMOS FET 82 has its drain connected to the junction node JN, its gate connected to the output node N4 and its source connected to GND. In this embodiment the NMOS FET 80 has the same size as the NMOS FET 74 and the NMOS FET 82 has the same size as the NMOS FET 76. Alternatively, there may be a predetermined scaling factor between the two FETS 74/80 and 76/82 of each pair.

The output node N4 can also be connected to resistance-setting NMOS FETs in further segments of the DAC circuitry, so as to enable the control circuitry 60 to operate in common for all segments.

Operation of the FIG. 8 control circuitry will now be described. The elements 62 to 68 serve to generate at the node N2 a potential $V_{DS(SAT)P}$ which is a measure of the drain-source saturation voltage of the switching transistors in the current switching circuitry (FIG. 3). Because of the difference in currents flowing through the FETs 64 and 66, and their different widths, the ratio of the current densities in the FETs 64 and 66 is 9:1 ($=(I_1-I_2)/w:I_2/3$ w). Because $V_{DS(SAT)}$ is proportional to the square root of current density, the ratio between the respective $V_{DS(SAT)}$s of the FETs 64 and 66 is 3:1. The respective $V_T$s of the FETs 64 and 66 are substantially the same. The potential at node N1 becomes equal to $V_{DS(SAT)64}+V_{T64}$, where the drain-source saturation voltage $V_{DS(SAT)64}$ of the FET 64 is e.g. 0.9V and the threshold voltage $V_{T64}$ of the FET 64 is e.g. 1V. Thus, the potential $V_{N1}$ of node N1 is, for example, 1.9V. The voltage drop across the FET 66 is $V_{DS(SAT)66}+V_{T66}$, where $V_{DS(SAT)66}$ is e.g. 0.3V and $V_{T66}$ is e.g. 1V, i.e. 1.3V. Thus, the potential at node N2 is approximately equal to $V_{DS(SAT)64}-V_{DS(SAT)66}$, and this potential is taken as the measure $V_{DS(SAT)P}$ of drain-source saturation voltages of the switching and cascode transistors in the current switching circuitry.

Incidentally, because the measure $V_{DS(SAT)P}$ is derived from the difference $V_{DS(SAT)64}-V_{DS(SAT)66}$ between the respective $V_{DS(SAT)}$s of two FETs 64 and 66, it is possible that it will not accurately reflect the actual $V_{DS(SAT)}$s of the FETs of interest in the current switching circuitry, i.e. the switching transistors and the cascode transistors (if used). However, if it is expected that the actual $V_{DS(SAT)}$s of the FETs of interest will be, say, 0.6V in total, then it is preferable to set the conditions of the FETs 64 and 66 so that their respective $V_{DS(SAT)}$s are offset equally on either side of that total actual $V_{DS(SAT)}$, which is why in this example $V_{DS(SAT)64}$ is set to 0.9V and $V_{DS(SAT)66}$ is set to 0.3V.

The second constant current source 72 sources a current $I_3$ that in this embodiment is substantially equal to the current I sourced by the constant current source 24 in the switch driver circuitry of FIG. 3. In this embodiment the NMOS FET 74 has the same (variable) resistance as the NMOS FET 80 is to provide the first resistor R1. Similarly, the second NMOS FET 76 has the same (variable) resistance as the NMOS FET 82 used to provide the resistor R2. This means that the voltage at the node N3 is the same as the voltage $V_{CN2}$ at the second common node CN2 in the switch driver circuitry. The effect of the amplifier 70, therefore, is to adjust the potential at the output node N4 until the potential at the node N3 is equal to the potential $V_{DS(SAT)P}$ of the node N2. Changing the N4-node potential changes the potential at the node N3 because the N4-node potential determines the respective resistances of the first and second NMOS FET transistors 74 and 76 in the control circuitry.

In this way, in this embodiment the potential $V_{CN2}$ of the second common node CN2 is set substantially equal to the measure $V_{DS(SAT)P}$.

It will be appreciated that, in the FIG. 8 circuitry, the resistances of the resistors R1 and R2 (provided by the NMOS FETs 80 and 82) each vary in accordance with the potential at the node N4. Accordingly, as $V_{CN2}$ is varied the potential variation at the junction node JN tracks the potential variation of the second common node CN2 so as to maintain the gate potential of the transistor 32 as a substantially fixed proportion (e.g. $\frac{2}{3}$) of the potential $V_{CN2}$.

The advantage of using the FIG. 8 control circuitry to adjust the potential of the second common node CN2 is that the ON output potential $V_{on}$ tracks $V_{DS(SAT)}$ variations of the main switching transistors and (if used) the cascode transistors in the current switching circuitry. The PMOS FET 32 serves automatically to cause $V_{OFF}$ to track $V_{DS(SAT)}$.

It will also be appreciated that in place of the PMOS FET 32 in the FIG. 3 embodiment, other circuit elements can be connected between the first and second output nodes ON1 and ON2 of the circuitry to achieve the same basic current-voltage conversion effect. In each case, it is preferable that the circuit element used has the same I-V characteristic irrespective of the direction of current flow through the element concerned. The I-V characteristic of the circuit element is preferably non-linear so as to provide a higher resistance at low values of current and a lower resistance at high values of current, but a linear circuit element such as an ohmic resistance element could be used.

Figure 9:
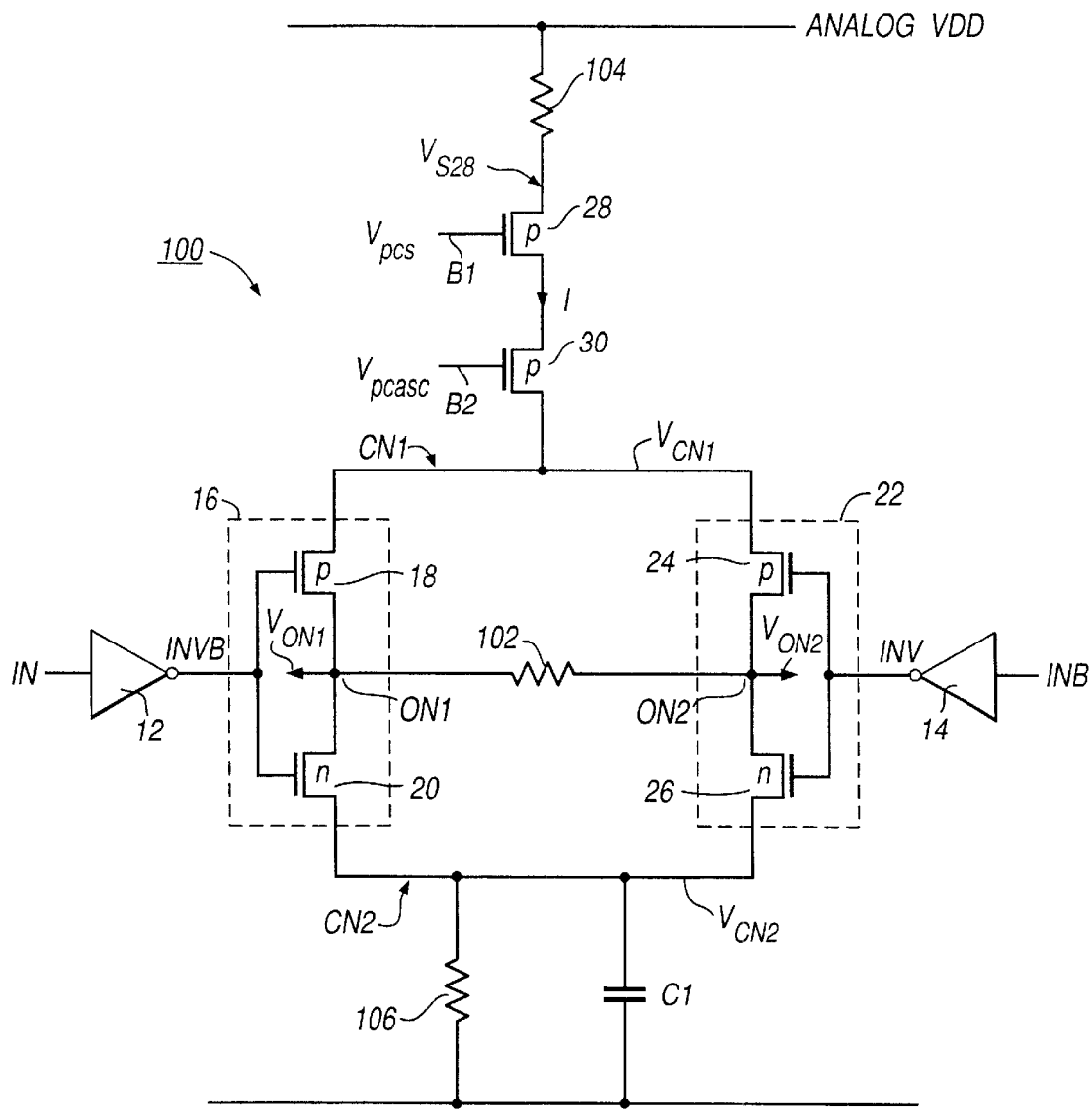
FIG. 9 shows parts of switch driver circuitry according to a second embodiment of the present invention.

A second embodiment of the present invention, using an ohmic resistance element between the first and second output nodes, will now be described with reference to FIG. 9. In FIG. 9, components that are the same as, or correspond closely to, components in the first embodiment of FIG. 3 have been denoted by the same reference numerals and an explanation thereof is omitted.

In the FIG. 9 embodiment, in place of the transistor 32, a resistor 102 is connected between the first and second output nodes ON1 and ON2. A further resistor 104 is connected between ANALOG VDD and the source of the constant current source transistor 28. Also, a further resistor 106 is connected between the second common node CN2 and GND in place of the series-connected resistors R1 and R2 in the first embodiment. Each of the resistors 102, 104 and 106 is an ohmic resistance element, for example a high-resistance n-diffusion resistor.

As in the first embodiment, the same current I that is sourced by the constant current source transistor 28 flows selectively either along a first current path P1, or along a second current path P2, through the circuitry, in dependence upon the state of the complementary input signals IN and INB.

As in the first embodiment, the potential $V_{CN2}$ of the second common node is determined by the product of the current I and the resistance $R_{106}$ of the resistor 106. In the second embodiment, the potential difference ΔV between the potentials of the first and second output nodes $V_{ON1}$ and $V_{ON2}$ is determined by the product of the current I and the resistance $R_{102}$ of the resistor 102. The I-V characteristic of the resistor 102 is the same for both directions of current flow through it, so the potential difference ΔV is the same whichever state the circuitry is in (in the steady-state)

The resistor 104 is provided to cause the potential $V_{S28}$ of the source of the current source transistor 28 to track changes in the resistance of the resistor 102. Within the circuitry, the resistors 102 and 104 are preferably placed physically close to one another so that their resistances will have a substantially fixed ratio irrespective of variations in their resistances brought about by process and/or temperature variations. Such variations may exhibit "gradients" across the device in one or more directions as the segments are laid out in a certain pattern over the device substrate. The make the layout within each segment insensitive to such gradients (at least in one direction) the resistor 104 may be divided into 2 equally-sized portions on opposite sides respectively of the resistor 102. This means that the resistor 104 has a common centroid with the resistor 102. Then, if the resistance of the resistor 102 in a segment has an increased value, so will the resistance of the resistor 104 of that segment. This has the effect of lowering the potential $V_{S28}$ at the source of the constant current source transistor 28 so that, assuming its gate potential $V_{pcs}$ remains unchanged (relative to ANALOG VDD), its gate-source voltage is made less negative, thereby reducing the current I. In this way, the product $I.R_{102}$, which defines ΔV, is left substantially unchanged despite the increase in $R_{102}$.

The ratios of the resistances $R_{102}$, $R_{104}$ and $R_{106}$ are, for example, 1:2:1, with I being approximately 80 μA and $R_{102}$ being approximately 7.5 kΩ. This provides a potential difference ΔV between the ON and OFF output potentials of approximately 0.6V.

When a resistance element such as the element 102 is used as the current-voltage conversion element it is not essential to use the matching resistance element 104 or, indeed, to carry out any compensation for resistance variation. In this respect, although the potential difference ΔV generated across the resistor 102 is kept substantially fixed by using such compensation, inevitably the change in current affects the circuitry in other ways and, for example, changes the speed of the switching operation of the segment. This may make it preferable to leave the current unchanged in response to resistance variations.

Comparing FIG. 4 with FIG. 9, a further advantage of the FIG. 4 circuitry over the FIG. 9 circuitry is that the resistance element 102 (and the compensating resistor 104 if used) is large physically compared to the PMOS FET 32, because a suitably large resistance (e.g. 7.5 kΩ) can only be achieved with a large physical structure (HN resistors may have a resistance of 1 kΩ/square). Such large structures have an appreciable parasitic capacitance. Also, when resistances are used, scaling of the circuitry becomes difficult since, if (say) the current is halved, the resistances must be doubled to achieve the same voltage, whereas with the PMOS FET 32 the voltage across it is maintained when the transistor is halved in size. Even worse, when the resistance is doubled, parasitic capacitance is also doubled, so that compared to the half-size transistors the parasitic capacitance goes up by a factor of 4. This makes the PMOS FET 32 far more preferable to use as the current-voltage conversion element.

Although the use of a circuit element having the same I-V characteristic for both directions of current flow between the output nodes is preferable, it will be appreciated that, by using two closely-matched uni-directional circuit elements connected in parallel between the two output nodes, substantially the same effect can be achieved. For example, back-to-back diode elements could be employed between the two output nodes. Each diode could be implemented using an MOS transistor with its gate connected to its source.

Although the foregoing embodiments have employed p-channel switching transistors, it will be appreciated that the present invention can be applied in other embodiments to current switching circuitry employing n-channel switching transistors (and a current sink in place of the current source). In this case, the polarities of the supply lines and the conductivity types of the transistors in the switch driver circuitry are reversed.

Furthermore, although the present invention has been described in relation to DACs, it will be understood by those skilled in the art that the present invention is applicable to any type of circuitry that includes switch elements that need to switch in complementary manner with accurately-controlled complementary switching signals.

What is claimed is:

1. Switch driver circuitry comprising:
   first and second output nodes;
   a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow; and
   switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities.

2. Switch driver circuitry as claimed in claim 1, further comprising first and second common nodes, said switching circuitry being connected to said first and second common nodes and being operable when in said first state to connect said first and second output nodes to said first and second common nodes respectively so as to create a first path for the flow of current from said first common node to said second common node via said output nodes, and also operable when in said second state to connect said first and second output nodes to said second and first common nodes respectively so as to create a second path, different from said first path, for the flow of current from said first common node to said second common node via said output nodes.

3. Switch driver circuitry as claimed in claim 2, wherein said current that flows through said first path when said switching circuitry has said first state is substantially equal in magnitude to said current that flows through said second path when said switching circuitry has said second state.

4. Switch driver circuitry as claimed in claim 2, further comprising a constant current source/sink connected operatively with one of said common nodes for maintaining the current flowing through each of said first and second paths at a substantially constant magnitude.

5. Switch driver circuitry as claimed in claim 4, wherein a current sourced, or sunk as the case may be, by said constant current source/sink has substantially said preselected magnitude.

6. Switch driver circuitry as claimed in claim 2, wherein one of said common nodes is connected by a resistance element to a reference potential line of the circuitry which, in use of the circuitry, is maintained at a substantially constant predetermined reference potential, for causing a potential of that common node to be substantially fixed in relation to said predetermined reference potential.

7. Switch driver circuitry as claimed in claim 2, wherein said switching circuitry comprises:
   a first field-effect transistor connected between said first common node and said first output node;
   a second field-effect transistor connected between said first output node and said second common node;
   a third field-effect transistor connected between said first common node and said second output node; and
   a fourth field-effect transistor connected between said second output node and said second common node; and
      control circuitry for causing said first and fourth-field-effect transistors to be turned ON and said second and third field-effect transistors to be turned OFF when said switching circuitry has said first state, and for causing said second and third field-effect transistors to be turned ON and said first and fourth field-effect transistors to be turned OFF when said switching circuitry has said second state.

8. Switch driver circuitry as claimed in claim 1, wherein a current-voltage characteristic of said current-voltage converter is substantially symmetrical for the flow of current through said current path in both said first and second directions.

9. Switch driver circuitry as claimed in claim 1, wherein said current-voltage converter has a non-linear current-voltage characteristic such that an effective resistance of the current-voltage converter is higher for low magnitudes of current than for high magnitudes of current.

10. Switch driver circuitry as claimed in claim 1, wherein said current-voltage converter comprises a field-effect transistor having its channel connected in series between said first and second output nodes.

11. Switch driver circuitry as claimed in claim 1, wherein said current-voltage converter comprises an ohmic resistance.

12. Switch driver circuitry as claimed in claim 11, further comprising current changing circuitry connected for changing the preselected magnitude of the current flowing through said current path when a resistance of said ohmic resistor in said current-voltage converter changes.

13. Switch driver circuitry as claimed in claim 12, wherein said current changing circuitry comprises a further ohmic resistor that is matched with said ohmic resistor of said current-voltage converter so that when a resistance of the ohmic resistor of the current-voltage converter changes, there is a corresponding change in resistance of said further ohmic resistor, the further ohmic resistor being connected so that when its resistance increases the magnitude of said current flowing through said current path decreases.

14. Switch driver circuitry as claimed in claim 13, wherein said further ohmic resistor has first and second portions arranged physically on opposite sides respectively of said ohmic resistance of the current-voltage converter.

15. A switch circuit comprising:
   first and second output nodes;
   a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow;
   switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities;
   a first switch element having a control terminal connected to said first output node and switchable from an OFF-state to an ON state by the change in the first-output-node potential brought about when said switching circuitry is switched from one of said first and second states to the other of those states; and
   a second switch element having a control terminal connected to said second output node and switchable from an ON state to a OFF state by the change in the second-output-node potential brought about when said switching circuitry is switched from said one state to said other state.

16. A switch circuit as claimed in claim 15, wherein each said switch element comprises a field-effect transistor.

17. A switch circuit as claimed in claim 16, wherein said current-voltage converter comprises a field-effect transistor having its channel connected in series between said first and second output nodes, and wherein said field-effect transistor of said current-voltage converter has the same conductivity type as said field-effect transistor of each said switch element.

18. A switch circuit as claimed in claim 15, further comprising an output node potential adjuster for adjusting the first-output-node potential and/or said second-output-node potential in dependence upon a measure of drain-source saturation voltage of one or more field-effect transistors of said switching circuitry.

19. A switch circuit as claimed in claim 18, wherein said one or more field-effect transistors are or comprise field-effect transistors of said switch elements.

20. A switch circuit as claimed in claim 15, further comprising:
   first and second common nodes, said switching circuitry being connected to said first and second common nodes and being operable when in said first state to connect said first and second output nodes to said first and second common nodes respectively so as to create a first path for the flow of current from said first common node to said second common node via said output nodes, and also operable when in said second state to connect said first and second output nodes to said second and first common nodes respectively so as to create a second path, different from said first path, for the flow of current from said first common node to said second common node via said output nodes, wherein one of said common nodes is connected by a resistance element to a reference potential line of the circuitry which, in use of the circuitry, is maintained at a substantially constant predetermined reference potential, for causing a potential of that common node to be substantially fixed in relation to said predetermined reference potential; and
   resistance adjustment circuitry for adjusting a resistance of said resistance element in dependence upon a measure of drain-source saturation voltage of one or more field-effect transistors of said switching circuitry.

21. A switch circuit as claimed in claim 20, wherein said one or more field-effect transistors are or comprise field-effect transistors of said switch elements.

22. A switch circuit as claimed in claim 18, further comprising:
   a first cascode element connected between the first switch element and a first output terminal of the switching circuitry; and
   a second cascode element connected between the second switch element and a second output terminal of the switching circuitry;
      wherein said one or more field-effect transistors are or comprise field-effect transistors of said cascode elements.

23. A switch circuit as claimed in claim 16, further comprising:
   first and second common nodes, said switching circuitry being connected to said first and second common nodes and being operable when in said first state to connect said first and second output nodes to said first and second common nodes respectively so as to create a first path for the flow of current from said first common node to said second common node via said output nodes, and also operable when in said second state to connect said first and second output nodes to said second and first common nodes respectively so as to create a second path, different from said first path, for the flow of current from said first common node to said second common node via said output nodes;
   and wherein said switching circuitry comprises:
      a first field-effect transistor connected between said first common node and said first output node;
      a second field-effect transistor connected between said first output node and said second common node;
      a third field-effect transistor connected between said first common node and said second output node;
      a fourth field-effect transistor connected between said second output node and said second common node; and
   control circuitry for causing said first and fourth field-effect transistors to be turned ON and said second and third field-effect transistors to be turned OFF when said switching circuitry has said first state, and for causing said second and third field-effect transistors to be turned ON and said first and fourth field-effect transistors to be turned OFF when said switching circuitry has said second state,
   wherein said first and third field-effect transistors have the same conductivity type as said field-effect transistors of said switch elements.

24. A switch circuit as claimed in claim 16, further comprising:
   first and second common nodes, said switching circuitry being connected to said first and second common nodes and being operable when in said first state to connect said first and second output nodes to said first and second common nodes respectively so as to create a first path for the flow of current from said first common node to said second common node via said output nodes, and also operable when in said second state to connect said first and second output nodes to said second and first common nodes respectively so as to create a second path, different from said first path, for the flow of current from said first common node to said second common node via said output nodes;
   and wherein said switching circuitry comprises:
      a first field-effect transistor connected between said first common node and said first output node;
      a second field-effect transistor connected between said first output node and said second common node;
      a third field-effect transistor connected between said first common node and said second output node;
      a fourth field-effect transistor connected between said second output node and said second common node; and
   control circuitry for causing said first and fourth field-effect transistors to be turned ON and said second and third field-effect transistors to be turned OFF when said switching circuitry has said first state, and for causing said second and third field-effect transistors to be turned ON and said first and fourth field-effect transistors to be turned OFF when said switching circuitry has said second state,
   wherein said second and fourth field-effect transistors have the opposite conductivity type to said field-effect transistors of said switch elements.

25. A digital-to-analog converter comprising switch driver circuitry comprising:
   first and second output nodes;
   a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow;
   switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities;

the digital-to-analog converter further comprising:
a first switch element having a control terminal connected to said first output node and switchable from an OFF state to an ON state by the change in the first-output-node potential brought about when said switching circuitry is switched from one of said first and second states to the other of those states;
a second switch element having a control terminal connected to said second output node and switchable from an ON state to a OFF state by the change in the second-output-node potential brought about when said switching circuitry is switched from said one state to said other state,
said first switch element being connected between first and second converter nodes and said second switch element being connected between said first node and a third converter node; and
a current source or current sink connected operatively to said first converter node for causing a substantially constant current to pass through said first converter node when the converter is in use.

26. A digital-to-analog converter comprising:
a plurality of differential switching circuits, each differential switching circuit having switch driver circuitry comprising:
first and second output nodes;
a current-voltage converter connected to said first and second output nodes to provide a current path through which current is permitted to flow in a first direction from said first to said second output node, or in a second direction from said second to said first output node, when the circuitry is in use, for producing a potential difference between said first and second output nodes that is dependent upon the magnitude and direction of the current flow;
switching circuitry connected with said first and second output nodes and switchable, in dependence upon an applied control signal, from a first state, in which a current of preselected magnitude is caused to flow in said first direction through said current path, to a second state in which a current of substantially the same magnitude as said preselected magnitude is caused to flow in said second direction through said current path, a current-voltage characteristic of the current-voltage converter being such that said potential differences produced respectively in said first and second states have substantially the same magnitudes but opposite polarities;
each said differential switching circuit further having:
a first switch element having a control terminal connected to said first output node and switchable from an OFF state to an ON state by the change in the first-output-node potential brought about when said switching circuitry is switched from one of said first and second states to the other of those states;
a second switch element having a control terminal connected to said second output node and switchable from an ON state to a OFF state by the change in the second-output-node potential brought about when said switching circuitry is switched from said one state to said other state,
said first switch element being connected between first and second nodes of the differential switching circuit and said second switch element being connected between said first node and a third node of the differential switching circuit; and
the respective second nodes of the differential switching circuits of said plurality being connected together, and the respective third nodes of the differential switching circuits of said plurality being connected together; and
the digital-to-analog converter further comprising a plurality of current sources or current sinks, corresponding respectively to the differential switching circuits of said plurality, each current source or current sink being connected operatively to said first node of its said corresponding differential switching circuit for causing a substantially constant current to flow therethrough when the converter is in use.

27. Switch driver circuitry comprising:
first and second output nodes;
current-voltage conversion means connected to the said first and second output nodes to provide a current path through which current is permitted to flow in a first direction from the said first to the said second output node, or in a second direction from the said second to the said first output node, when the circuitry is in use, for producing a potential difference between the said first and second output nodes that is dependent upon the magnitude and direction of the current flow; and
switching means connected with the said first and second output nodes and switchable, in dependence upon an applied control signal, from a first state, in which a current of preselected magnitude is caused to flow in the said first direction through the said current path, to a second state in which a current of substantially the same magnitude as the said preselected magnitude is caused to flow in the said second direction through the said current path, a current-voltage characteristic of the current-voltage conversion means being such that the said potential differences produced respectively in the said first and second states have substantially the same magnitudes but opposite polarities.

28. Switching circuitry comprising:
first and second output nodes;
current-voltage conversion means connected to the said first and second output nodes to provide a current path through which current is permitted to flow in a first direction from the said first to the said second output node, or in a second direction from the said second to the said first output node, when the circuitry is in use, for producing a potential difference between the said first and second output nodes that is dependent upon the magnitude and direction of the current flow;
switching means connected with the said first and second output nodes and switchable, in dependence upon an applied control signal, from a first state, in which a current of preselected magnitude is caused to flow in the said first direction through the said current path, to a second state in which a current of substantially the same magnitude as the said preselected magnitude is caused to flow in the said second direction through the said current path, a current-voltage characteristic of the current-voltage conversion means being such that the said potential differences produced respectively in the said first and second states have substantially the same magnitudes but opposite polarities;
- a first switch element having a control terminal connected to the said first output node and switchable from an OFF state to an ON state by the change in the first-output-node potential brought about when the said switching means are switched from one of said first and second states to the other of those states; and
- a second switch element having a control terminal connected to the said second output node and switchable from an ON state to a OFF state by the change in the second-output-node potential brought about when the said switching means are switched from the said one state to the said other state.

29. A digital-to-analog converter comprising switch driver circuitry comprising:

first and second output nodes;

current-voltage conversion means connected to the said first and second output nodes to provide a current path through which current is permitted to flow in a first direction from the said first to the said second output node, or in a second direction from the said second to the said first output node, when the circuitry is in use, for producing a potential difference between the said first and second output nodes that is dependent upon the magnitude and direction of the current flow;

switching means connected with the said first and second output nodes and switchable, in dependence upon an applied control signal, from a first state, in which a current of preselected magnitude is caused to flow in the said first direction through the said current path, to a second state in which a current of substantially the same magnitude as the said preselected magnitude is caused to flow in the said second direction through the said current path, a current-voltage characteristic of the current-voltage conversion means being such that the said potential differences produced respectively in the said first and second states have substantially the same magnitudes but opposite polarities;

the converter further comprising:
- a first switch element having a control terminal connected to the said first output node and switchable from an OFF state to an ON state by the change in the first-output-node potential brought about when the said switching means are switched from one of said first and second states to the other of those states;
- a second switch element having a control terminal connected to the said second output node and switchable from an ON state to a OFF state by the change in the second-output-node potential brought about when the said switching means are switched from the said one state to the said other state,
- said first switch element being connected between first and second converter nodes and said second switch element being connected between said first node and a third converter node; and
- a current source or current sink connected operatively to the said first converter node for causing a substantially constant current to pass through said first converter node when the converter is in use.

30. A digital-to-analog converter comprising:

a plurality of differential switching circuits, each differential switching circuit having switch driver circuitry comprising:

first and second output nodes;

current-voltage conversion means connected to the said first and second output nodes to provide a current path through which current is permitted to flow in a first direction from the said first to the said second output node, or in a second direction from the said second to the said first output node, when the circuitry is in use, for producing a potential difference between the said first and second output nodes that is dependent upon the magnitude and direction of the current flow;

switching means connected with the said first and second output nodes and switchable, in dependence upon an applied control signal, from a first state, in which a current of preselected magnitude is caused to flow in the said first direction through the said current path, to a second state in which a current of substantially the same magnitude as the said preselected magnitude is caused to flow in the said second direction through the said current path, a current-voltage characteristic of the current-voltage conversion means being such that the said potential differences produced respectively in the said first and second states have substantially the same magnitudes but opposite polarities;

each said differential switching circuit further having:
- a first switch element having a control terminal connected to the said first output node and switchable from an OFF state to an ON state by the change in the first-output-node potential brought about when the said switching means are switched from one of said first and second states to the other of those states;
- a second switch element having a control terminal connected to the said second output node and switchable from an ON state to a OFF state by the change in the second-output-node potential brought about when the said switching means are switched from the said one state to the said other state,
- said first switch element being connected between first and second nodes of the differential switching circuit and said second switch element being connected between said first node and a third node of the differential switching circuit; and the respective second nodes of the differential switching circuits of the said plurality being connected together, and the respective third nodes of the differential switching circuits of the said plurality being connected together; and the converter further comprising a plurality of current sources or current sinks, corresponding respectively to the differential switching circuits of the said plurality, each current source or current sink being connected operatively to the said first node of its said corresponding differential switching circuit for causing a substantially constant current to flow therethrough when the converter is in use.

* * * * *

UNITED STATES PATENT AND TRADEMARK OFFICE
CERTIFICATE OF CORRECTION

PATENT NO. : 6,340,939 B1
DATED : January 22, 2002
INVENTOR(S) : Ian Juso Dedic

It is certified that error appears in the above-identified patent and that said Letters Patent is hereby corrected as shown below:

Title page,
Item [30], Foreign Application Priority Data, change "9926652" to -- 9926652.0 --.

Signed and Sealed this

Twenty-third Day of July, 2002

Attest:

Attesting Officer

JAMES E. ROGAN
Director of the United States Patent and Trademark Office